United States Patent
Kim

(10) Patent No.: US 8,673,676 B2
(45) Date of Patent: Mar. 18, 2014

(54) SURFACE PROCESSING METHOD OF SILICON SUBSTRATE FOR SOLAR CELL, AND MANUFACTURING METHOD OF SOLAR CELL

(75) Inventor: Byung-Jun Kim, Cheonan (KR)

(73) Assignee: Wonik IPS Co., Ltd. (KR)

( * ) Notice: Subject to any disclaimer, the term of this patent is extended or adjusted under 35 U.S.C. 154(b) by 496 days.

(21) Appl. No.: 12/973,345

(22) Filed: Dec. 20, 2010

(65) Prior Publication Data
US 2012/0060925 A1    Mar. 15, 2012

(30) Foreign Application Priority Data
Sep. 10, 2010    (KR) .................. 10-2010-0088935

(51) Int. Cl.
*H01L 21/302*    (2006.01)

(52) U.S. Cl.
USPC ............... 438/71; 438/704; 257/E21.229

(58) Field of Classification Search
USPC ...................................... 438/72, 97
See application file for complete search history.

(56) References Cited

U.S. PATENT DOCUMENTS

| | | | |
|---|---|---|---|
| 6,340,640 B1 * | 1/2002 | Nishimoto et al. | 438/753 |
| 7,459,098 B2 * | 12/2008 | Inomata et al. | 216/37 |
| 7,556,740 B2 * | 7/2009 | Inomata et al. | 216/45 |
| 7,556,741 B2 * | 7/2009 | Inomata et al. | 216/45 |
| 7,951,637 B2 * | 5/2011 | Weidman et al. | 438/57 |
| 7,964,499 B2 * | 6/2011 | Kim et al. | 438/652 |
| 8,207,005 B2 * | 6/2012 | Weidman et al. | 438/57 |
| 2004/0058468 A1 * | 3/2004 | Takahashi et al. | 438/42 |
| 2006/0160336 A1 * | 7/2006 | Mizutani et al. | 438/488 |
| 2007/0128761 A1 * | 6/2007 | Owada et al. | 438/98 |
| 2009/0007966 A1 * | 1/2009 | Isaka et al. | 136/259 |
| 2009/0311821 A1 * | 12/2009 | Dimitrov et al. | 438/71 |
| 2009/0325336 A1 * | 12/2009 | Abbott et al. | 438/57 |
| 2010/0018562 A1 * | 1/2010 | Kurahashi et al. | 136/244 |
| 2010/0024871 A1 | 2/2010 | Oh et al. | |
| 2010/0239818 A1 * | 9/2010 | Lee et al. | 428/156 |
| 2010/0243040 A1 * | 9/2010 | Kim | 136/255 |
| 2010/0258176 A1 * | 10/2010 | Kang et al. | 136/256 |
| 2010/0258177 A1 * | 10/2010 | Ko et al. | 136/256 |

(Continued)

FOREIGN PATENT DOCUMENTS

| | | |
|---|---|---|
| EP | 1855322 | 11/2007 |
| EP | 2149915 | 2/2010 |

OTHER PUBLICATIONS

Extended European Search Report—European Application No. 10015837 issued on May 13, 2011, citing EP 2149915, US 2007/128761, US 6,340,640, and EP 1855322.

*Primary Examiner* — David Vu
*Assistant Examiner* — Earl Taylor
(74) *Attorney, Agent, or Firm* — Cantor Colburn LLP

(57) ABSTRACT

Disclosed is a surface processing method of a crystalline silicon substrate for a solar cell, and a method for manufacturing a solar cell. The surface processing method of a substrate for a solar cell comprises first surface processing step for forming a plurality of first protrusions on surfaces of a substrate by etching the crystalline silicon substrate by using an aqueous solution, second surface processing step for forming a plurality of second protrusions smaller than the first protrusions by adhering etching residues onto an upper surface, a light receiving surface among the surfaces of the substrate, by using first etching gas, and residue removing step for removing etching residues adhered onto the upper surface of the substrate having undergone the second surface processing step.

18 Claims, 6 Drawing Sheets

(56) References Cited

U.S. PATENT DOCUMENTS

2010/0275993 A1* 11/2010 Kim et al. ............... 136/257
2011/0300697 A1* 12/2011 Kohira et al. ............ 438/546
2012/0060925 A1* 3/2012 Kim ........................ 136/261
2012/0085729 A1* 4/2012 Kim ........................ 216/11
2012/0174960 A1* 7/2012 Hashigami et al. ...... 136/244

* cited by examiner

SURFACE PROCESSING METHOD OF SILICON SUBSTRATE FOR SOLAR CELL, AND MANUFACTURING METHOD OF SOLAR CELL

BACKGROUND OF THE INVENTION

1. Field of the Invention

The present invention relates to a solar cell, and particularly, to a surface processing method of a crystalline silicon substrate for a solar cell, and a method for manufacturing a solar cell.

2. Background of the Invention

A solar cell indicates a cell capable of generating electromotive force by using photo-electromotive effect, one of photoelectric effects.

The solar cell may be classified into a silicon-based solar cell, a compound semiconductor solar cell, a compound or lamination-type solar cell according to material of substrate. Here, the silicon-based solar cell may be categorized into a crystalline silicon solar cell such as a monocrystalline silicon and a multicrystalline silicon, and an amorphous silicon solar cell.

The efficiency of solar cell is determined by a plurality of factors such as reflectivity of a substrate, and is maximized by minimizing reflectivity on a light receiving surface.

In the field of a crystalline silicon solar cell having relatively low fabrication costs, various methods for minimizing reflectivity in order to enhance efficiency fo the solar cell are being proposed.

SUMMARY OF THE INVENTION

Therefore, an object of the present invention is to provide a surface processing method of a substrate for a solar cell capable of effectively forming minute protrusions for reducing light reflectivity, by forming a plurality of protrusions on a surface of a substrate through combinations of wet-etching process and dry-etching process, and then by removing etching residues adhered to the surface of the substrate during dry-etching process, and a method for manufacturing a solar cell.

To achieve these and other advantages and in accordance with the purpose of the present invention, as embodied and broadly described herein, there is provided a surface processing method of a substrate for a solar cell, the method comprising: first surface processing step for forming a plurality of first protrusions on surfaces of a substrate by etching the crystalline silicon substrate by using an aqueous solution; second surface processing step for forming a plurality of second protrusions smaller than the first protrusions by adhering etching residues onto an upper surface, a light receiving surface among the surfaces of the substrate, by using first etching gas; and residue removing step for removing etching residues adhered onto the upper surface of the substrate having undergone the second surface processing step.

The aqueous solution used in the first surface processing step may include HF and $HNO_3$.

Substrate damage removing step for removing damages formed on the surfaces of the crystalline silicon substrate sliced from a crystalline silicon ingot, by using acid aqueous solution or alkali aqueous solution may be further performed before the first surface processing step.

The crystalline silicon substrate may be monocrystalline silicon substrate or miltcrystalline silicon substrate.

In an assumption that an area of a surface in a completely flat state where anti-reflection film is to be formed, among the surfaces of the crystalline silicon substrate having undergone the first surface processing step, is an ideal surface area, a ratio between a substantial surface area etched in the first surface processing step and the ideal surface area may be preferably in the range of 1.2~3.2.

The residue removing step may be performed by dipping the substrate in a wet station containing residue removing liquid, or by transferring the substrate by roller.

As the residue removing liquid, hydrofluoric acid aqueous solution may be used. The residue removing liquid may include water or hydrofluoric acid aqueous solution, and ultrasonic waves may be applied to the residue removing liquid when performing the residue removing step.

In the residue removing step, the etching residues remaining on an upper surface of the substrate may be removed by plasmarizing second etching gas.

The second etching gas may include fluorine or chlorine.

The second etching gas may include one of HCl, $ClF_3$, NF, $CF_4$, $C_3F_8$, $NF_3$, $C_2F_6$, $CF_4$, $F_2$, $CHF_3$, $SF_6$ and $Cl_2$.

The second etching gas may have a lower reactivity with the substrate than the first etching gas.

The first etching gas may be gas including elements which belong to Group VII, and the second etching gas may be gas including at least one of elements rather than the elements which belong to Group VII.

The second etching gas may include at least one of inert gas and oxygen.

Hydrofluoric acid dipping step of dipping the substrate in hydrofluoric acid aqueous solution, may be further performed after the residue removing step.

To achieve these and other advantages and in accordance with the purpose of the present invention, as embodied and broadly described herein, there is also provided a method for manufacturing a solar cell including the surface processing method of a substrate for a solar cell.

To achieve these and other advantages and in accordance with the purpose of the present invention, as embodied and broadly described herein, there is still also provided a solar cell manufactured by the method for manufacturing a solar cell.

The present invention may have the following advantages.

Firstly, the efficiency of the solar cell may be enhanced by reducing reflectivity on the substrate by forming a plurality of first protrusions and a plurality of second protrusions smaller than the first protrusions on the surface of the substrate through wet-etching process and dry-etching process, and then by removing etching residues adhered to the surface of the substrate during dry-etching process.

Especially, the first surface processing, wet-etching process may be performed by using acid aqueous solution at low temperature, not by using alkali aqueous solution at high temperature. This may enhance the reproducibility and reliability of processes.

Secondly, the first protrusions may be firstly formed by the first surface processing step, the wet-etching process. This may shorten time taken to perform the second surface processing step for forming the second protrusions by dry-etching process.

Thirdly, the residue removing step for removing etching residues adhered onto the surface of the substrate may be further performed after forming the protrusions by wet-etching process and dry-etching process. This may effectively remove etching residues, byproducts generated in the second surface processing step, and thus may prevent lowering of the efficiency of a solar cell due to etching residues remained the surface of the solar cell.

Fourthly, the first surface processing step for forming the protrusions by wet-etching process may be included. This may prevent a color difference occurring on a substrate positioned at the edge when etching a plurality of substrates in the second surface processing step.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

In the drawings.

DETAILED DESCRIPTION OF THE INVENTION

Description will now be given in detail of the present invention, with reference to the accompanying drawings.

Hereinafter, a surface processing method of a substrate for a solar cell, and a method for manufacturing a solar cell according to the present invention will be explained in more detail.

Figure 1:
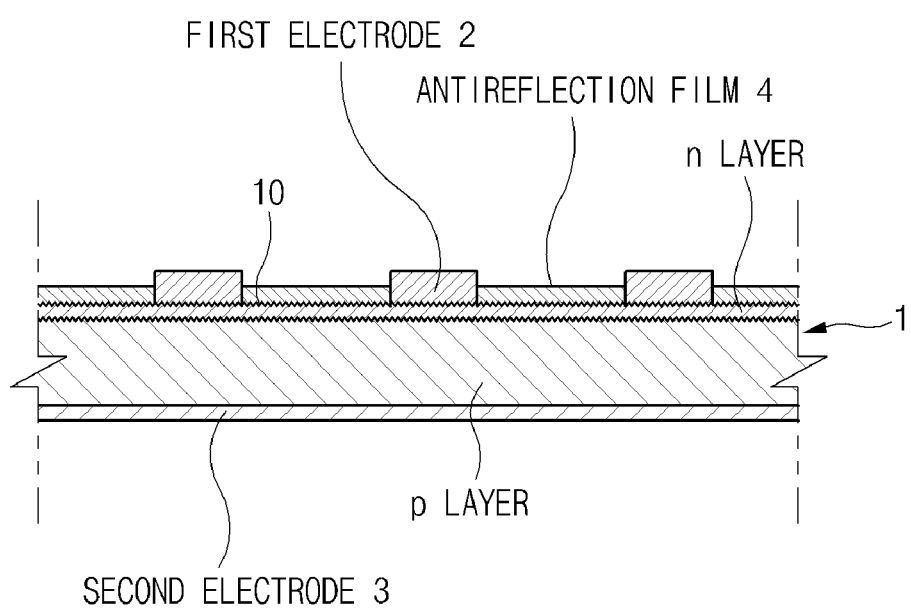
FIG. 1 is a sectional view showing one example of a structure of a solar cell.
Figure 2:
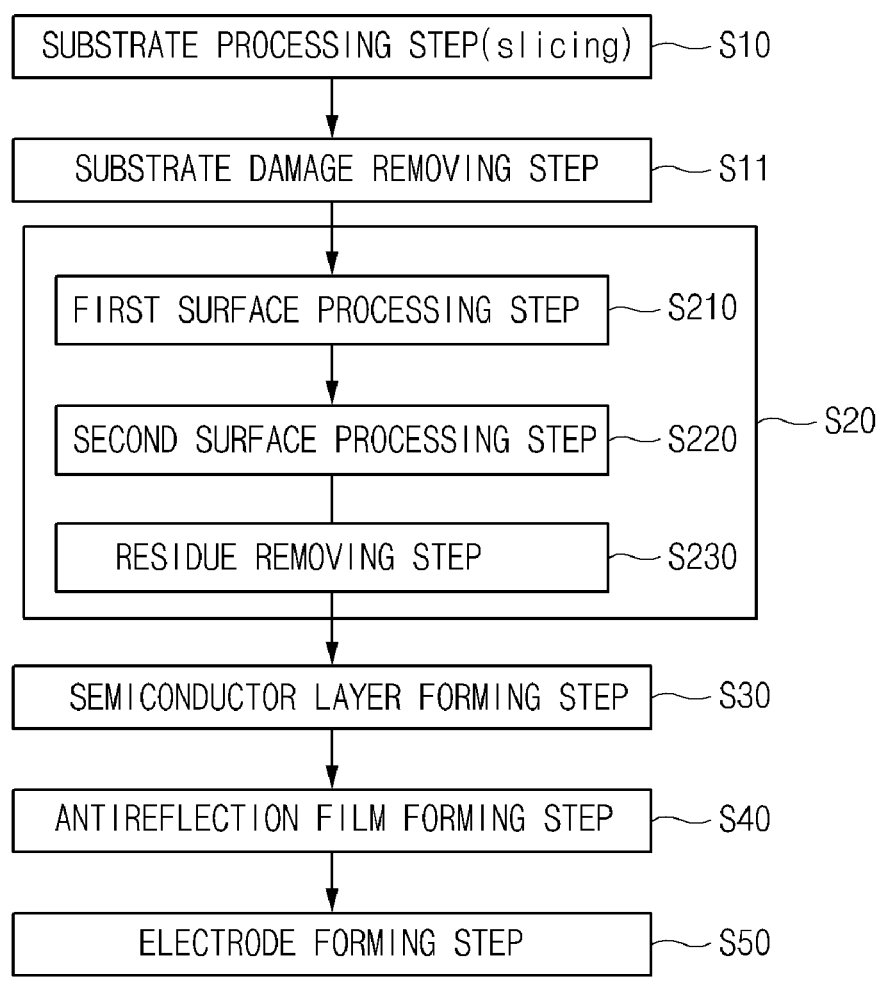
FIG. 2 is a flowchart showing processes for manufacturing a solar cell according to the present invention.

FIG. 1 is a sectional view showing one example of a structure of a solar cell, and FIG. 2 is a flowchart showing processes for manufacturing a solar cell according to the present invention.

As shown in FIG. 1, an example of the solar cell according to the present invention comprises a substrate 1 having 'p-n' junction structure, first electrode 2 and second electrode 3 formed on a light receiving surface (upper surface) and a bottom surface of the substrate 1, respectively, and anti-reflection film 4 formed on the upper surface of the substrate 1.

The substrate 1 may be formed of crystalline silicon, more preferably, multicrystalline silicon.

Semiconductor structure, electrodes, etc. of the substrate 1 may have various modifications according to a type of a solar cell. For instance, the electrode may be formed only on the bottom surface of the substrate 1, not on the light receiving surface.

As shown in FIG. 2, the method for manufacturing a solar cell according to the present invention comprises a surface processing step S20 for forming protrusions on the surface of the silicon substrate 1, semiconductor layer forming step S30 for forming 'p-n' junction structure after the surface processing step S29, anti-reflection layer forming step S40 for forming anti-reflection film 4 on the surface of the substrate 1 after the semiconductor layer forming step S30, and electrode forming step S50 of forming electrodes 2 and 3 on at least one of the surfaces of the substrate 1.

Each step of the method for manufacturing a solar cell includes various processes, and detailed descriptions thereof will be omitted for convenience. Hereinafter, the surface processing step S20 of the surface processing method of a substrate for a solar cell according to the present invention will be explained in more detail.

The silicon substrate 1 may be manufactured by substrate processing step S10 by slicing a silicon ingot with using a wire saw.

The surface processing method in accordance with the present invention is for enhancing the efficiency of a solar cell by forming a plurality of protrusions on the upper surface, i.e. the light receiving surface of the substrate 1 so as to reduce reflectivity.

As shown in FIG. 2, the surface processing method of a substrate for a solar cell comprises first surface processing step S210 for forming a plurality of first protrusions on surfaces of the substrate 1 by etching the crystalline silicon substrate 1 by using aqueous solution, second surface processing step S220 for forming a plurality of second protrusions by dry-etching a surface of the substrate 1 where anti-reflection film 4 is to be formed, among the surfaces of the substrate 1 formed with a plurality of first protrusions 10 through the first surface processing step S210, by using first etching gas, and residue removing step S230 for removing etching residues 40 adhered onto the upper surface of the substrate 1.

Figure 3A:
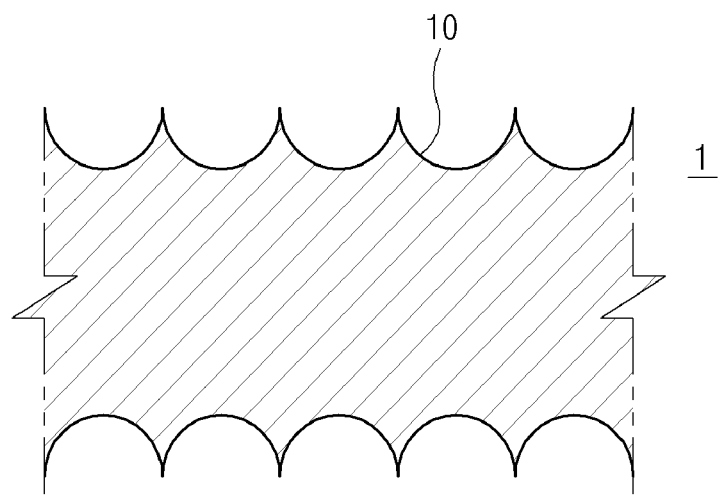
FIG. 3A is a partial sectional view showing a substrate firstly surface-processed by first surface processing step for the processes for manufacturing a solar cell of FIG. 2.

The first surface processing step S210 is for forming the first protrusions 10 by etching the surfaces of the crystalline silicon substrate 1 by using acid aqueous solution. That is to say, the first surface processing step S210 is for forming the first protrusions 10 on the surface of the substrate 1, as shown in FIG. 3A.

In case of using acid aqueous solution in the first surface processing step S210 when the silicon substrate 1 is milticrystalline silicon substrate, reflectivity on the light receiving surface of the substrate 1 where anti-reflection film 4 is to be formed is much lowered than in case of using alkali aqueous solution. This may increase light receiving amount to enhance performance of a solar cell.

In case of using alkali aqueous solution in the first surface processing step S210, the step is much influenced by material of the substrate 1. On the contrary, in case of using acid aqueous solution, dependency on the material of the substrate 1 may be reduced.

In the first surface processing step S210, the first protrusions 10 are preferably formed on only the light receiving surface (upper surface) of the substrate 1. Accordingly, in order to prevent formation of the first protrusions 10 on the bottom surface, the opposite surface to the light receiving surface, mask may be formed on the bottom surface of the substrate 1.

The acid aqueous solution used in the first surface processing step S210 may be aqueous solution including $HNO_3$ and HF, and weight ratio, concentration, etc., may be determined with consideration of etching temperature, etching depth, etc.

Preferably, the acid aqueous solution used in the first surface processing step S210 is aqueous solution including $HNO_3$ and HF having weight ratio of 1:1~5.5:1. Here, the aqueous solution may further include surfactant and catalyst.

As the acid aqueous solution, may be used aqueous solution including $HNO_3$, HF and $CH_3COOH$ (or deionized water).

Preferably, etching depth in the first surface processing step S210 is in the range of 1 μm~10 μm.

Figure 4:
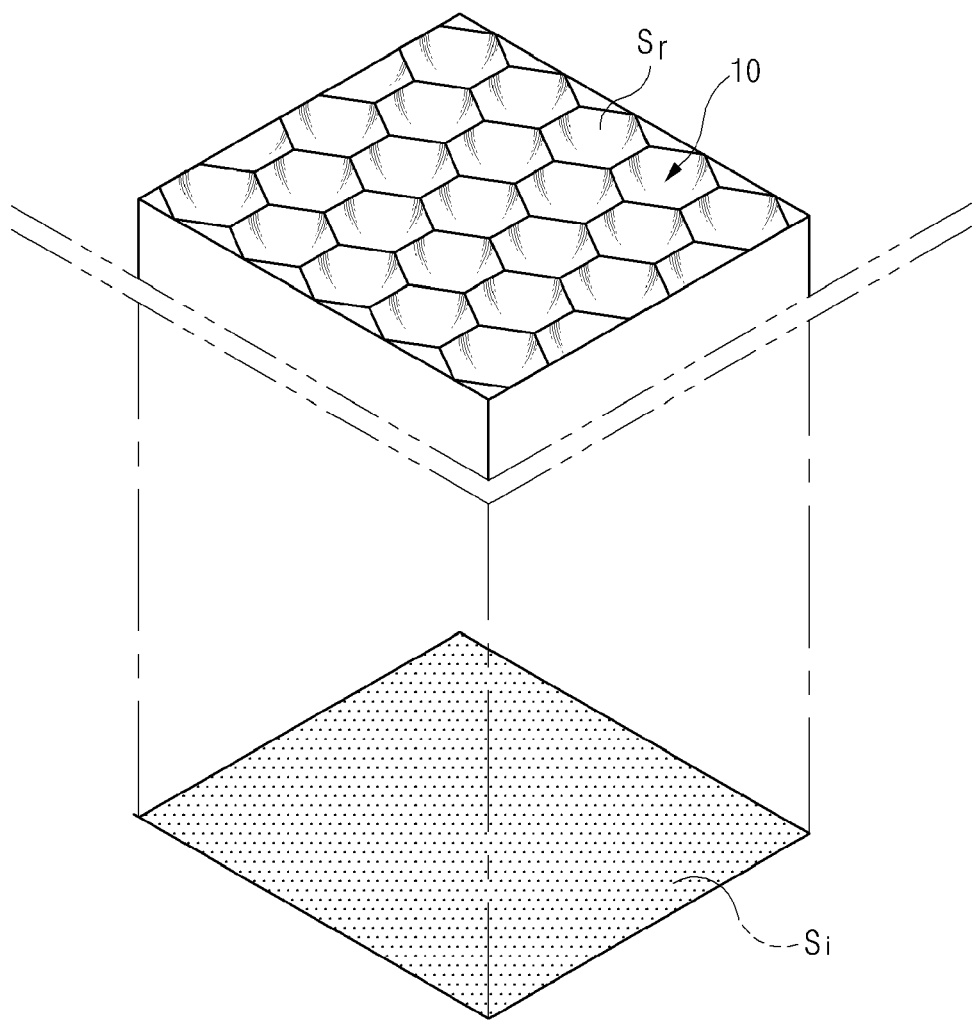
FIG. 4 is a conceptual view showing a state that first protrusions are formed by first surface processing step for the processes for manufacturing a solar cell of FIG. 2.

FIG. 4 is a conceptual view showing a state that first protrusions are formed by first surface processing step for the processes for manufacturing a solar cell of FIG. 2.

As shown in FIG. 4, the first protrusions 10 formed in the first surface processing step S210 may be formed by forming grooves of semi-spherical shape (supposing that grooves of ideal shape are formed) having etching depth of 1 μm~10 μm, and diameter of 2 μm~20 μm. FIG. 4 shows ideal shape of the first protrusions 10, formed by formation of grooves of a semi-spherical shape on the surface of the substrate 1.

The first surface processing step S210 may be performed by inline method or dipping method. Here, the inline method is for performing etching process by transferring the substrate 1 by roller in a wet station containing alkali aqueous solution or acid aqueous solution (preferably, acid aqueous solution). And, the dipping method is for performing etching process by dipping the substrate 1 in a wet station containing alkali aqueous solution or acid aqueous solution (preferably, acid aqueous solution).

In case of performing the first surface processing step S210 by the inline method, the etching process may be performed at temperature of 6~10° C. for 1~10 minutes.

In case of performing the first surface processing step S210 by the dipping method, the etching process may be performed at temperature of 6~10° C. for 15~25 minutes.

The first surface processing step S210 performed by wet-etching process using acid aqueous solution may further include subsequent process for drying the surface of the substrate 1 having undergone the etching process.

Figure 3B:
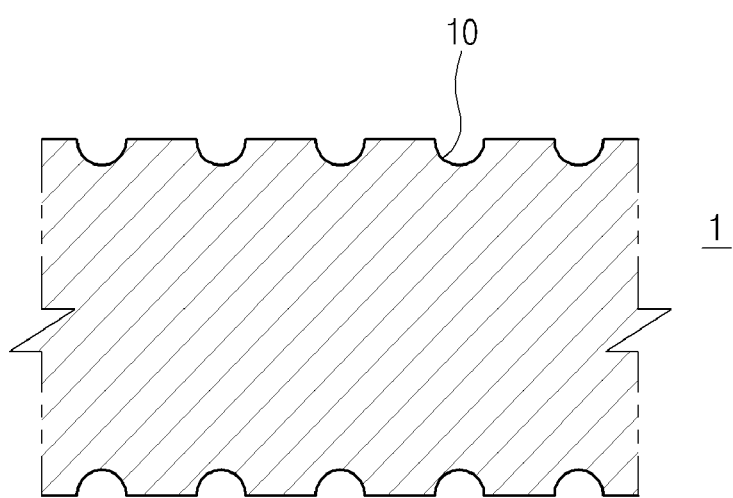
FIG. 3B is a partial sectional view showing a case that an area ratio is less than 1.2 after first surface processing step.
Figure 3C:
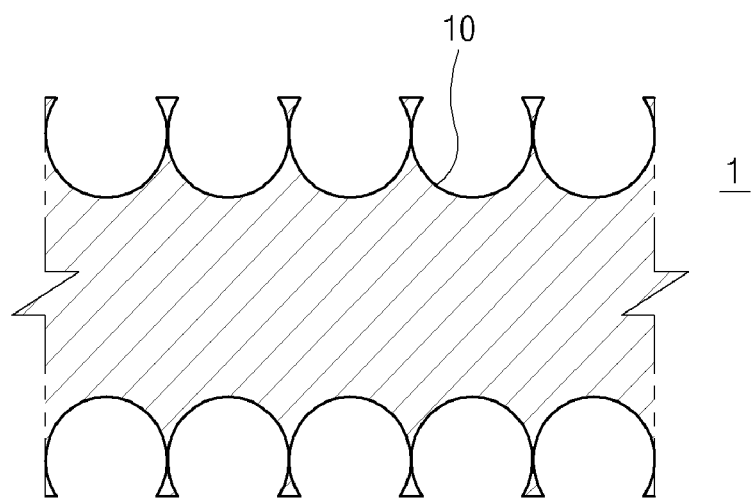
FIG. 3C is a partial sectional view showing a case that an area ratio is more than 3.2 after first surface processing step.

FIG. 3A is a partial sectional view showing a substrate firstly surface-processed by first surface processing step for the processes for manufacturing a solar cell of FIG. 2, FIG. 3B is a partial sectional view showing a case that an area ratio is less than 1.2 after first surface processing step, FIG. 3C is a partial sectional view showing a case that an area ratio is more than 3.2 after first surface processing step, and FIG. 4 is a conceptual view showing a state that first protrusions are formed by first surface processing step for the processes for manufacturing a solar cell of FIG. 2. FIGS. 3A to 3B and 4 are schematically shown for convenience. A shape of the first protrusions 10, an etching depth, a height of an uppermost end of the substrate, and a size of the substrate may have deviations, and a sectional shape or a substantial shape are irregular and various.

As shown in FIG. 4, it is assumed that, among the surfaces having thereon the first protrusions 10 through the first surface processing step S210, an area of a surface where anti-reflection film 4 is to be formed is a substantial surface area (Sr), and an area of a surface which is in a completely flat state is an ideal surface area (Si). Under these assumptions, a ratio between the substantial surface area (Sr) and the ideal surface area (Si) of the crystalline silicon substrate 1 having undergone the first surface processing step S210 is preferably in the range of 1.2~3.2.

If the ratio is less than 1.2, there is a problem that lowering of reflectivity by the first surface processing step S210 is not great since a small number of the first protrusions 10 are generated as shown in FIG. 3B.

If the ratio is more than 3.2, there is a problem that a surface processing effect is reduced since a reaction by one of RIE (Reactive Ion Etching), ICP (Inductively Coupled Plasma) and plasmarization in the subsequent step, the second surface processing step S220 is not great.

Furthermore, if the ratio is more than 3.2, there is a problem that gap is formed since diffusion of metallic material for forming electrode is prevented in the subsequent step (electrode forming step S50).

Before the first surface processing step S210, the method of the present invention may further comprise substrate damage removing step for removing damages formed on the surfaces of the crystalline silicon substrate 1 sliced from a crystalline silicon ingot during slicing process, by using acid aqueous solution or alkali aqueous solution.

Here, As the acid aqueous solution, may be used a mixture of $HNO_3$ and HF, $HNO_3$, HF and $CH_3COOH$ (or deionized water). Here, a ratio of $H_2O$ for the mixture may be determined by those who skilled in the art.

In case of using alkali aqueous solution, the substrate damage removing step may be performed at temperature of 80° C.~90° C. for about 15~25 minutes. As the alkali aqueous solution, NaOH or KOH is used. Alternatively, IPA (2-iso-propyl-alcohol) may be added to the alkali aqueous solution.

When the silicon substrate is monocrystalline, the substrate damage removing step is preferably performed by using alkali aqueous solution. On the other hand, when the silicon substrate is multicrystalline, the substrate damage removing step is preferably performed by using acid aqueous solution.

The substrate damage removing step may be integrally performed with the first surface processing step S210.

The second surface processing step S220 is for forming second protrusions 20 by dry-etching the upper surface of the crystalline silicon substrate 1 surface-processed in the first surface processing step S210, by using first etching gas.

Especially, the second surface processing step S220 is for forming a plurality of second protrusions 20 on the upper surface of the substrate 1 as shown in FIG. 4. Here, the second protrusions 20 are smaller than the first protrusions 10.

The first protrusions 10 have width of 2 μm~20 μm and height of 1 μm~10 μm, and the second protrusions 20 have a size of 100 nm~800 nm, such as height of 100 nm~800 nm. Here, the ideal outer sectional line of first protrusions 10 desirably have a semi-circle shape. Accordingly, the width of the first protrusions 10 corresponds to diameter, and the height thereof may be etching depth which corresponds to radius.

The dry etching performed in the second surface processing step S220 is for etching the substrate 1 by plasmarizing first etching gas, and may be performed by reactive ion etching (RIE) method or by using ICP (Inductively Coupled Plasma).

The first etching gas used for the dry-etching may include $Cl_2/CF_4/O_2$, $SF_6/O_2$, $CHF_3/SF_6/O_2$, $NF_3$ and $F_2$, and a mixture thereof. Here, the dry etching is performed for about several seconds~several minutes. As the first etching gas, a mixture of many types of gases may be used. Alternatively, the first etching gas may be sequentially injected into a processing module with time difference.

When the dry-etching is performed by RIE method, a cover member (not shown) formed with a plurality of openings may be installed above the substrate 1 so as to accelerate formation of the second protrusions 20.

The first etching gas used in the second surface processing step S220 may further include $H_2O$. In case of further adding $H_2O$ to the first etching gas, an etching speed was significantly increased. This was checked through experiments.

Here, the dry-etching may be performed by transferring a tray loaded with a plurality of substrates 1, and by loading the substrates onto a substrate supporting plate inside a dry-etching apparatus.

Figure 5:
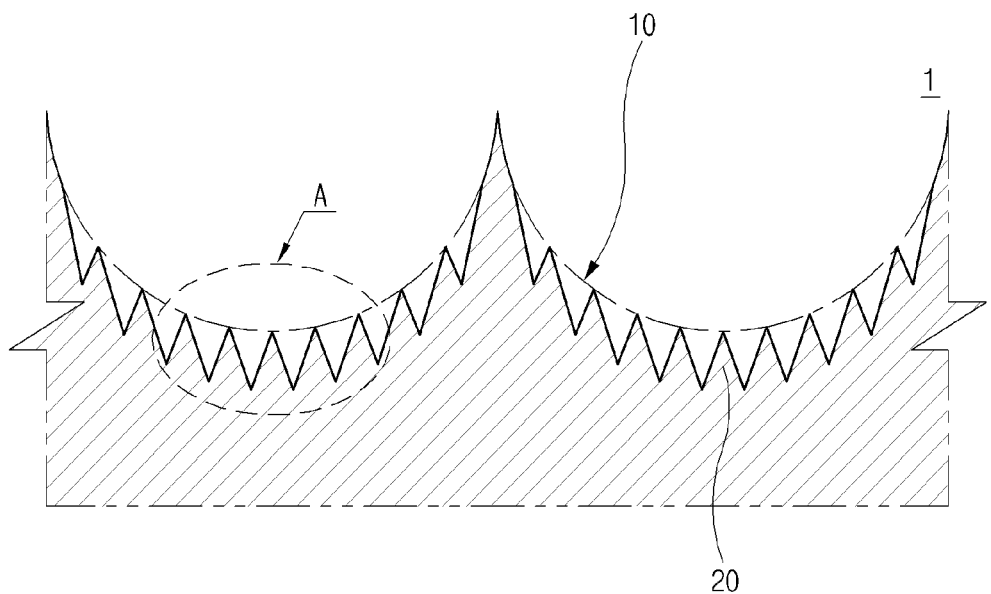
FIG. 5 is a conceptual view showing a substrate having undergone first and second surface processing steps of the processes for manufacturing a solar cell of FIG. 2.

The substrate 1 having undergone surface processing in the second surface processing step S220 has an upper surface shown in FIG. 5.

A plurality of second protrusions 20, i.e. minute protrusions smaller than the first protrusions 10 formed in the first surface processing step S210 are formed on the surface of the substrate 1.

As shown in FIG. 5, each of the second protrusions 20 has a triangular sectional surface, and has one side towards a top side of the first protrusions 10 and shorter than another side.

In the first surface processing step S210, the first protrusions 10 are formed on all the surfaces of the substrate 1 including an upper surface where anti-reflection film 4 is formed, a bottom surface opposite to the upper surface, and side surfaces.

The first protrusions 10 formed on the surfaces of the substrate 1 enhance a light receiving rate by increasing light reflectivity. However, these first protrusions 10 make formation of electrode pattern difficult when manufacturing a substrate for a solar cell having high efficiency, the substrate formed with both the first and the second electrodes only on the bottom surface in electrode forming step S50, subsequent process performed after forming the first protrusions 10.

Accordingly, the first protrusions 10 are preferably formed only on the light receiving surface among the surfaces of the substrate 1. And, the other surfaces rather than the light receiving surface need to be removed for convenience of subsequent processes.

Especially, in order to easily form electrode pattern on the surface of the substrate 1 by using mask, among the surfaces of the substrate 1 where the first protrusions 10 have been formed in the first surface processing step S210, the bottom surface opposite to the upper surface where anti-reflection film 4 is to be formed is dry-etched. Accordingly, the first protrusions 10 formed on the bottom surface of the substrate may be removed.

Figure 6:
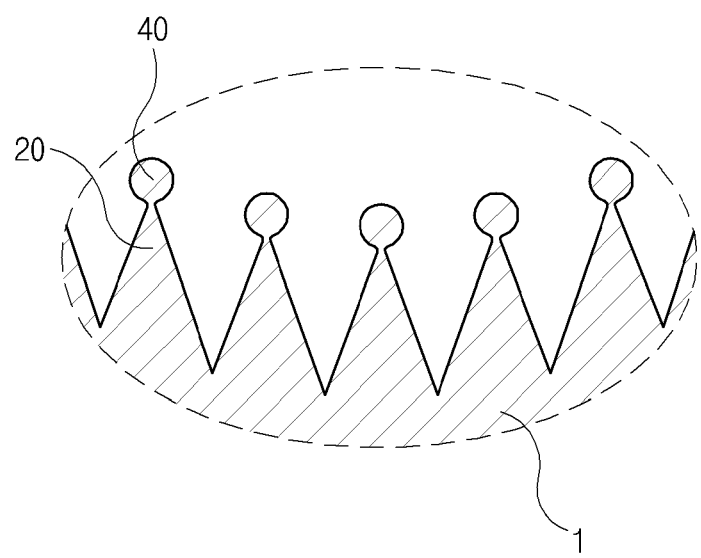
FIG. 6 is an enlarged sectional view of a part 'A' in FIG. 5, which shows a state before removing etching residues on a surface of a substrate.

FIG. 6 is an enlarged sectional view of a part 'A' in FIG. 5, which shows a state before removing etching residues on the surface of the substrate.

As shown in FIG. 6, in the second surface processing step S220, etching residues 40 are formed by using first etching gas, adhered to the upper surface of the substrate 1, and thus used to form the second protrusions 20 smaller than the first protrusions 10. After the second surface processing step S220, the etching residues 40 for forming the second protrusions 20 are removed by residue removing step S230.

In the residue removing step S230, may be used any method to remove the etching residues 40 adhered to the upper surface of the substrate 1.

For instance, in the residue removing step S230, the etching residues 40 may be removed by dipping the substrate 1 in a wet station (not shown) containing residue removing liquid, e.g., hydrofluoric acid aqueous solution, or by moving the substrate 1 in hydrofluoric acid aqueous solution contained in the water station by roller.

As another embodiment, the residue removing liquid may include water or hydrofluoric acid aqueous solution. Here, in order to remove the etching residues 40 more effectively, ultrasonic waves may be applied to the residue removing liquid. That is, once ultrasonic waves are applied to the residue removing liquid contained in a wet station, the residue removing liquid applies impact to the etching residues 40 adhered to the substrate 1. Accordingly, the etching residues 40 are removed from the substrate 1.

Here, an apparatus for applying ultrasonic waves into the wet station is determined by the etching residues 40 to be removed. And, the ultrasonic waves have a frequency high enough to remove the etching residues 40. For instance, the frequency may be variably selected within the range of several tens of kHz several hundreds of kHz.

As another example of the residue removing step S230, the etching residues 40 may be removed from the upper surface of the substrate 1 by using second etching gas.

In the residue removing step S230, the etching residues 40 may be removed from the upper surface of the substrate 1 by plasmarizing second etching gas by RIE, ICP, etc.

As the second etching gas used in the residue removing step S230, may be used gas including fluorine or chlorine, e.g., one of HCl, $ClF_3$, NF, $CF_4$, $C_3F_8$, $NF_3$, $C_2F_6$, $CF_4$, $F_2$, $CHF_3$, $SF_6$ and $Cl_2$. If $SF_6$ is used as the second etching gas, the first etching gas may include at least one of $H_2O$ and $O_2$.

If reactivity with the substrate 1 is relatively high in the residue removing step S230, the second protrusions 20 may be damaged. Accordingly, the second etching gas preferably has lower reactivity with the substrate 1 than the first etching gas for forming the second protrusions 20.

The fact that the second etching gas has lower reactivity with the substrate 1 than the first etching gas means that the second etching gas is more inactive than the first etching gas with respect to material of the substrate 1.

Accordingly, the first etching gas may be gas including elements which belong to Group VII, and the second etching gas may be gas including at least one of elements rather than the elements which belong to Group VII.

If the second etching gas has lower reactivity with the substrate 1 than the first etching gas, reactivity with the substrate 1 is low. This may allow only the etching residues 40 formed on an upper end of the second protrusions 20 to be removed, without damaging the second protrusions 20 formed on the surface of the substrate 1 at the time of dry-etching process.

A processing module for performing the residue removing step S230 may have any configuration to perform dry-etching process such as RIE and ICP.

The residue removing step S230 may be performed by covering a tray loaded with the substrates 1 with a cover member formed with a plurality of openings.

The cover member prevents damage of the substrate 1 by preventing the substrate 1 from being directly exposed to plasma when the silicon substrate 1 is etched by RIE.

When performing the residue removing step S230 by dry-etching process using RIE, the residue removing step S230 may have similar processes to the second surface processing step S220. Accordingly, the second surface processing step S220 and the residue removing step S230 may be performed by one processing chamber. Alternatively, the second surface processing step S220 and the residue removing step S230 may be performed by inline or cluster type substrate processing system including a first processing chamber for performing the second surface processing step S220 and a second processing chamber for performing the residue removing step S230.

After the residue removing step S230, may be additionally performed hydrofluoric acid dipping step S250 of dipping the substrate 1 in hydrofluoric acid (HF) aqueous solution so as to completely remove the etching residues from the upper surface of the substrate 1.

In the hydrofluoric acid dipping step S250, the etching residues 40 separated from the substrate 1 by the residue removing step S230, or the etching residues 40 having cracks are completely separated from the substrate 1. Accordingly, the etching residues 40 that may remain on the substrate 1 are removed from the substrate 1.

The substrate 1 having undergone the surface-processing step had reflectivity of 7.79, which was significantly lower than reflectivity (350 nm~1050 nm, 28.96%) of the substrate 1 having undergone only the substrate damage removing step.

The foregoing embodiments and advantages are merely exemplary and are not to be construed as limiting the present disclosure. The present teachings can be readily applied to other types of apparatuses. This description is intended to be illustrative, and not to limit the scope of the claims. Many alternatives, modifications, and variations will be apparent to those skilled in the art. The features, structures, methods, and other characteristics of the exemplary embodiments described herein may be combined in various ways to obtain additional and/or alternative exemplary embodiments.

As the present features may be embodied in several forms without departing from the characteristics thereof, it should also be understood that the above-described embodiments are not limited by any of the details of the foregoing description, unless otherwise specified, but rather should be construed broadly within its scope as defined in the appended claims, and therefore all changes and modifications that fall within the metes and bounds of the claims, or equivalents of such metes and bounds are therefore intended to be embraced by the appended claims.

What is claimed is:

1. A surface processing method of a crystalline silicon substrate for a solar cell, the method comprising:
    a crystalline silicon substrate providing step for providing a substrate which comprises crystalline silicon;
    a first surface processing step for forming a plurality of first protrusions on surfaces of the substrate by etching the substrate by using an aqueous solution;
    a second surface processing step for forming a plurality of second protrusions smaller than the first protrusions by adhering etching residues onto an upper surface, a light receiving surface among the surfaces of the substrate, by using a first etching gas; and
    a residue removing step for removing the etching residues adhered onto the upper surface of the substrate having undergone the second surface processing step,
    wherein in an assumption that an area of a surface in a completely flat state where an anti-reflection film is to be formed, among the surfaces of the substrate having undergone the first surface processing step, is an ideal surface area, a ratio between a substantial surface area etched in the first surface processing step and the ideal surface area is in the range of 1.2~3.2.

2. The method of claim 1, wherein the aqueous solution used in the first surface processing step includes HF and HNO3.

3. The method of claim 1, further comprising a substrate damage removing step for removing damages formed on the surfaces of the crystalline silicon substrate sliced from a crystalline silicon ingot, by using an acid aqueous solution or alkali aqueous solution, before the first surface processing step.

4. The method of claim 1, wherein the crystalline silicon substrate is a monocrystalline silicon substrate or a multicrystalline silicon substrate.

5. The method of claim 1, wherein in the residue removing step, the etching residues are removed by dipping the substrate in a wet station containing residue removing liquid, or by transferring the substrate by roller.

6. The method of claim 5, wherein the residue removing liquid is hydrofluoric acid aqueous solution.

7. The method of claim 5, wherein the residue removing liquid includes water or hydrofluoric acid aqueous solution, and ultrasonic waves are applied to the residue removing liquid when performing the residue removing step.

8. The method of claim 1, wherein in the residue removing step, the etching residues remaining on an upper surface of the substrate are removed by plasmarizing a second etching gas.

9. The method of claim 8, wherein the second etching gas includes fluorine or chlorine.

10. The method of claim 8, wherein the second etching gas includes one of HCl, ClF3, NF, CF4, C3F8, NF3, C2F6, F2, CHF3, SF6 and Cl2.

11. The method of claim 8, wherein the second etching gas has a lower reactivity with the substrate than the first etching gas.

12. The method of claim 8, wherein the first etching gas is gas including elements which belong to Group VII, and the second etching gas is gas including at least one of elements rather than the elements which belong to Group VII.

13. The method of claim 8, wherein the second etching gas includes at least one of inert gas and oxygen.

14. The method of claim 5, further comprising a hydrofluoric acid dipping step of dipping the substrate in hydrofluoric acid aqueous solution, after the residue removing step.

15. A method for manufacturing a solar cell including the surface processing method of a substrate for a solar cell according to claim 1.

16. The method of 15, further comprising a hydrofluoric acid dipping step of dipping the substrate in hydrofluoric acid aqueous solution, after the residue removing step.

17. A method for manufacturing a solar cell including the surface processing method of a substrate for a solar cell according claim 4.

18. A method for manufacturing a solar cell including the surface processing method of a substrate for a solar cell according claim 1.

* * * * *